United States Patent
Zhang et al.

(10) Patent No.: US 12,038,809 B1
(45) Date of Patent: Jul. 16, 2024

(54) FAILURE ANALYSIS FOR UNCORRECTABLE ERROR EVENTS

(71) Applicant: SK hynix Inc., Gyeonggi-do (KR)

(72) Inventors: Fan Zhang, Fremont, CA (US); Shiangjyh Steve Chang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/179,235

(22) Filed: Mar. 6, 2023

(51) Int. Cl.
*G06F 11/10* (2006.01)
*H03M 13/11* (2006.01)

(52) U.S. Cl.
CPC ..... *G06F 11/1076* (2013.01); *H03M 13/1102* (2013.01)

(58) Field of Classification Search
None
See application file for complete search history.

(56) References Cited

U.S. PATENT DOCUMENTS

| | | | |
|---|---|---|---|
| 5,991,308 A * | 11/1999 | Fuhrmann | H04J 13/00 348/E7.07 |
| 8,041,990 B2 | 10/2011 | O'Connor et al. | |
| 8,996,957 B1 * | 3/2015 | Northcott | H03M 13/2906 714/763 |
| 9,626,242 B2 | 4/2017 | Healy et al. | |
| 11,429,485 B1 * | 8/2022 | Hussain | G06F 12/0246 |
| 2012/0291127 A1 * | 11/2012 | Rangarajan | H04L 1/0046 714/799 |
| 2019/0158223 A1 * | 5/2019 | Carlough | H04L 1/0045 |
| 2019/0278653 A1 | 9/2019 | Padilla, Jr. et al. | |
| 2020/0004628 A1 | 1/2020 | Ben-Rubi et al. | |
| 2020/0112395 A1 * | 4/2020 | Carsello | H04L 69/22 |
| 2020/0201785 A1 * | 6/2020 | Hanna | G06F 11/1004 |
| 2022/0019357 A1 * | 1/2022 | Cho | G06F 3/0679 |
| 2022/0091914 A1 | 3/2022 | Otterstedt et al. | |
| 2022/0129347 A1 | 4/2022 | Fuller | |
| 2022/0209791 A1 | 6/2022 | Steiner et al. | |
| 2022/0254435 A1 | 8/2022 | Terada | |
| 2022/0350715 A1 | 11/2022 | Zhou et al. | |
| 2022/0358012 A1 | 11/2022 | Palmer | |
| 2022/0358016 A1 | 11/2022 | Park et al. | |
| 2023/0030776 A1 | 2/2023 | Richter et al. | |

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).*

(Continued)

*Primary Examiner* — Daniel F. McMahon
(74) *Attorney, Agent, or Firm* — Weaver Austin Villeneuve & Sampson LLP

(57) ABSTRACT

When stored data is retrieved from a memory using a given logical address, an initial checksum is computed over the data, and an error correction decoding can be performed to generate a decoded data payload. The decoded data payload may include decoded data and a decoded logical address. An uncorrectable error failure analysis can be performed based on the initial checksum, the error correction decoder status, and the decoded logical address to determine which error type has occurred from a plurality of error types.

20 Claims, 11 Drawing Sheets

(56) References Cited

OTHER PUBLICATIONS

Li, C. et al., "From Correctable Memory Errors to Uncorrectable Memory Errors: What Error Bits Tell," SC'22: Proceedings of the International Conference on High Performance Computing, Networking, Storage and Analysis, Nov. 2022, Article No. 76, pp. 1-14, URL: https://dl.acm.org/doi/10.5555/3571885.3571986.
Patel, M. et al., "HARP: Practically and Effectively Identifying Uncorrectable Errors in Memory Chips That Use On-Die Error-Correcting Codes," Micro '21: Micro-54: 54th Annual IEEE/ACM International Symposium on Microarchitecture, Oct. 2021, pp. 623-640, URL: https://dl.acm.org/doi/10.1145/3466752.3480061.

* cited by examiner

UECC Failure Analysis Logic
402

| Error Type 404 | | | L2P Corruption 404a | Memory PA Corruption, or Media Defect 404b | Reliability Issue 404c |
|---|---|---|---|---|---|
| ICS > PT & Decoder Fail | | | MAYBE | YES | NO |
| ICS < PT | Decoder Pass | LA Match | NO | NO | NO |
| | | LA Mismatch | YES | NO | NO |
| | Decoder Fail | | MAYBE | NO | YES |

FIG. 4

FAILURE ANALYSIS FOR UNCORRECTABLE ERROR EVENTS

BACKGROUND

Error-correction codes (ECCs) are frequently used for various types of data storage devices such as NAND flash memories. ECCs are also frequently used during the process of data transmission. ECC refers to codes that add redundant data, or parity data, to a message, such that the message can be recovered by a receiver equipped with a decoder, even when one or more errors were introduced, either during the process of transmission, or storage. Low-density parity-check (LDPC) codes are an example of ECC. In general, an ECC decoder can correct a limited number of errors, with the number depending on the type of code used and/or the error correction capability of the decoder itself. However, some errors cannot be corrected by the ECC decoder, which can result in an uncorrectable ECC (UECC) failure. In such cases, it is desirable to determine the type of failure mechanism of the uncorrectable error so that an appropriate mitigation action can be taken.

BRIEF SUMMARY

Techniques to detect and differentiate between possible failure mechanisms, when an uncorrectable error has occurred in a storage device, are described. According to some embodiments, a data payload comprising data, a logical address, and metadata is received to be stored in a memory at a physical address associated with the logical address. The memory can be part of the storage device. A cyclic redundancy check (CRC) value can be calculated over the data payload, and an error correction encoding can be performed over the data payload and the CRC value to generate an error correction code (ECC) value. A pseudo-random seed can be generated using the physical address associated with the logical address, and can be used to scramble the data payload, the CRC value, and the ECC value to generate a storage data unit. The storage data unit can be stored in the memory at the physical address.

According to some embodiments, a storage data unit can be retrieved from the memory using a given logical address. The storage data unit can be de-scrambled to generate a de-scrambled data unit, which may comprise a data payload, a CRC value, and an ECC value. An initial checksum over the de-scrambled data unit can be computed, and an error correction decoding on the de-scrambled data unit can be performed to generate a decoded data payload. The decoded data payload may comprise decoded data, a decoded logical address, and decoded metadata. Some embodiments can be used to perform failure analysis based on the initial checksum, a decoder status, and the decoded logical address to determine which type of error has occurred from a plurality of error types so that an appropriate fix can be determined.

According to some embodiments, a storage device may include a memory and a controller coupled to the memory. The controller is operable to retrieve a storage data unit from the memory using a given logical address, and de-scramble the storage data unit to generate a de-scrambled data unit. The de-scrambled data unit may comprise a data payload, a CRC value, and an ECC value. The controller is also operable to compute an initial checksum over the de-scrambled data unit, and perform error correction decoding on the de-scrambled data unit to generate a decoded data payload comprising decoded data, a decoded logical address, and decoded metadata. The controller is also operable to determine which type of error has occurred from a plurality of error types based on the initial checksum, a decoder status, and the decoded logical address.

BRIEF DESCRIPTION OF THE DRAWINGS

Various embodiments in accordance with the present disclosure will be described with reference to the drawings, in which:

FIG. 4 illustrates an example table for UECC failure analysis logic that can be used to determine a type of error from a plurality of error types, according to some embodiments;

DETAILED DESCRIPTION

Figure 1:
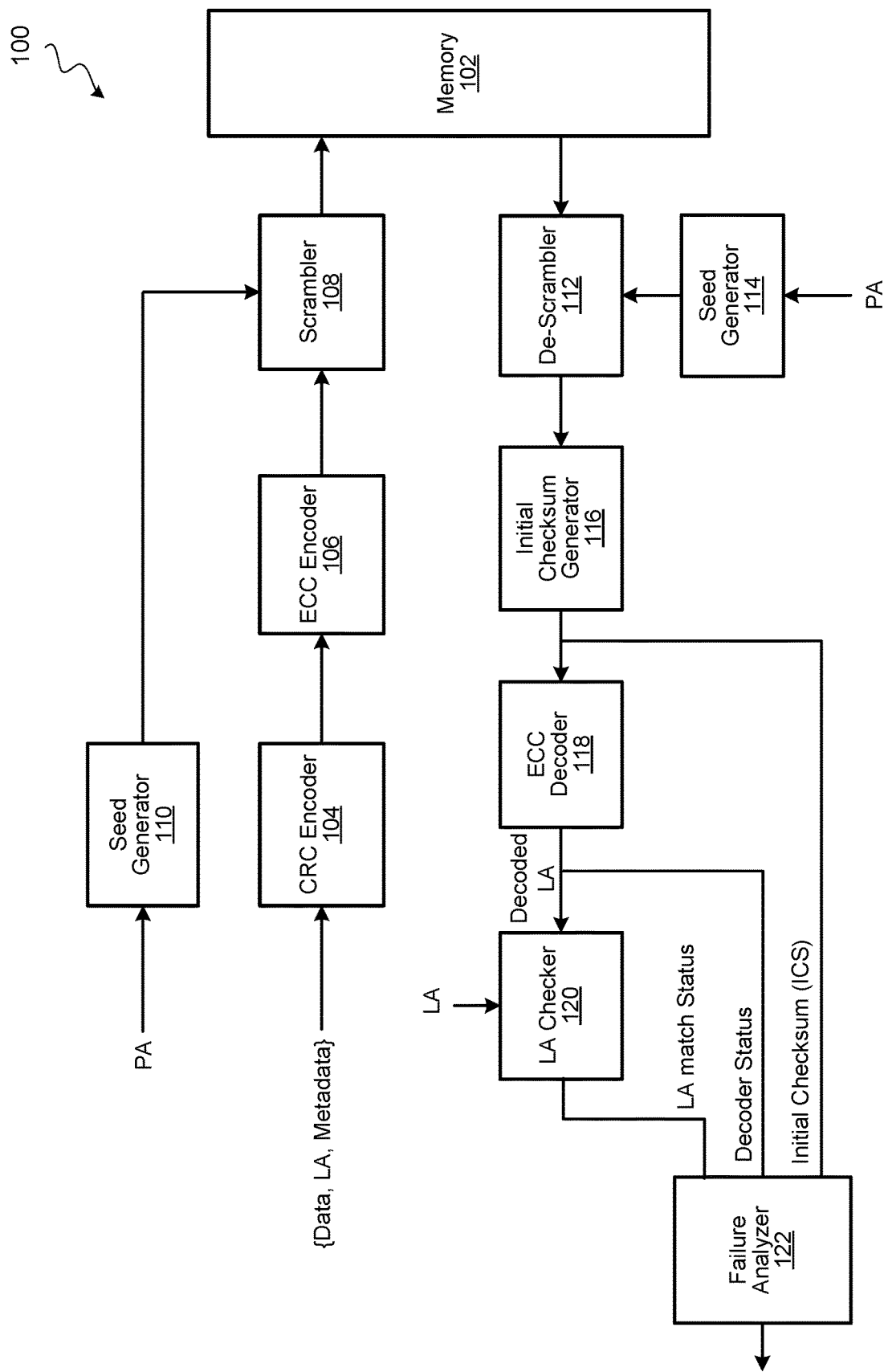
FIG. 1 illustrates an example high level block diagram of a storage device having a failure analyzer that can be used to detect and differentiate between different uncorrectable error events, according to some embodiments.

Error correction codes (ECC), such as, low-density parity-check (LDPC) codes, can be used to correct a variety of errors in storage devices as well as data transfers. However, in some instances, uncorrectable errors may occur due to a variety of failure mechanisms and can result in an uncorrectable ECC (UECC) failure. As an example, an uncorrectable error may occur due to corruption in the translation between the logical address and the physical address, which can cause a read command to retrieve data from the storage device using the wrong physical address. Another type of uncorrectable error may occur when the storage device corrupts the physical address such that data is fetched from the wrong physical address, or when a media defect (data corruption in the memory) is encountered. A further type of uncorrectable error may occur due to a reliability issue when a failed bit count (FBC) of the storage device is higher than the ECC correction capability.

In some cases, a failure analysis can be performed to determine the failure mechanism of the error, and employ any suitable mitigation action. The techniques disclosed herein can be used to detect and differentiate between different types of failure mechanisms when an error has occurred in the storage device.

In some embodiments, when data is written to memory using a logical address, the data, logical address, and metadata can form a data payload. The data payload can be protected using a cyclic redundancy check (CRC) value and an error correction code (ECC) such as a low-density parity check (LDPC) code. The data payload, CRC, and ECC can be scrambled to generate a storage data unit, and the storage data unit can be stored at a physical address corresponding to the logical address in the memory of a storage device. The scrambling can be performed using a pseudo-random seed generated from the physical address.

When the stored data is retrieved from the memory using the logical address, the stored data is de-scrambled to generate a de-scrambled data unit. The de-scrambling can be performed using a pseudo-random seed generated from a physical address associated with the logical address. An initial checksum is computed over the de-scrambled data unit. If the de-scrambled data unit contains errors, the de-scrambled data unit can be decoded (e.g., using LDPC decoding) to generate decoded data, a decoded logical address, and decoded metadata. According to some embodiments, a failure analysis can be performed to determine the type of error that has occurred based on a combination of whether the initial checksum exceeds a parity threshold, whether the decoder is successful in recovering the data (e.g., decoder status is pass or fail), and whether the decoded logical address matches the logical address used to read the data.

In the description provided herein, for the purposes of explanation, specific details are set forth in order to provide a thorough understanding of certain inventive embodiments. However, it will be apparent that various embodiments may be practiced without these specific details. Hence, the figures and description are not intended to be restrictive.

FIG. 1 illustrates an example high level block diagram 100 of a storage device having a failure analyzer that can be used to detect and differentiate between different uncorrectable error (UECC) events, according to some embodiments. The storage device in FIG. 1 can prepare the data for storing to memory, retrieve the stored data from memory, and perform failure analysis when an uncorrectable error has occurred to identify the type of uncorrectable error from a plurality of error types. The failure analyzer can be part of a memory controller that communicates with a host computing device. The data being stored in the storage device can be provided by a host application executing on a host computing device. In various embodiments, one or more components of the memory controller in FIG. 1 described further below (e.g., CRC encoder 104, ECC encoder 106, scrambler 108, seed generator 110/114, de-scrambler 112, initial checksum generator 116, ECC decoder 118, logical address checker 120, failure analyzer 122) can be implemented in software, hardware, or a combination thereof.

In some examples, a data payload is received to be stored in a memory 102 of a storage device at a physical address (PA) associated with a logical address (LA). The storage device can be, for example, a solid-state drive (SSD), and memory 102 can be implemented using non-volatile memories such as flash memories (e.g., NAND flash memories). The data payload may comprise the data to be stored, the LA, and metadata associated with the data. The metadata may include information such as data management information or other data integrity information associated with the data being stored. The metadata may be provided by the host application, or can be generated by the internal firmware of the memory controller.

A CRC encoder 104 can be used to calculate a CRC value over the data payload. An ECC encoder 106 can be used to perform an error correction encoding over the data payload and the CRC value to generate an error correction code (ECC) value. A scrambler 108 can be used to scramble the data payload, the CRC value, and the ECC value using a pseudo-random seed to generate a storage data unit for storing to the memory 102. A seed generator 110 can be used to generate the pseudo-random seed using the PA associated with the LA. In some implementations, the pseudo-random seed is a pseudo noise (PN) sequence that is generated using a linear feedback shift register (LFSR) or another suitable method. For example, the scrambler 108 can scramble the data payload, CRC, and ECC by adding the PN sequence to the concatenation of the data payload, CRC, and ECC using binary addition. In some implementations, translations between the LAs to PAs are stored in an address translation table in the storage device. The address translation table can be stored, for example, in random access memory such as dynamic random-access memory (DRAM) accessible by the memory controller. Each PA may be mapped to a physical page in the memory 102, and can be used to access the memory 102 for write and read operations. An example data flow for preparing the data to be stored in the memory 102 is described with reference to FIG. 2.

Figure 2:
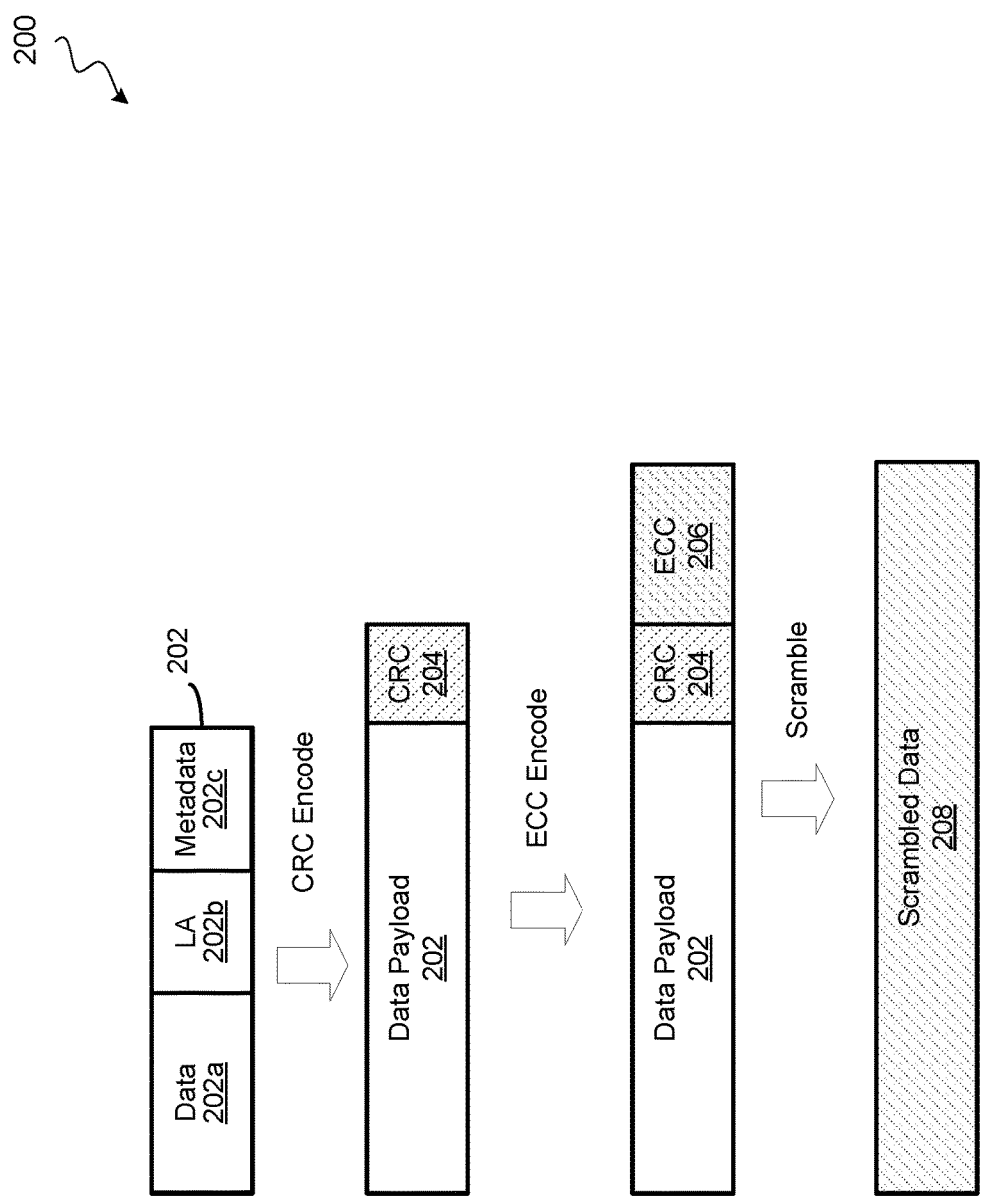
FIG. 2 illustrates an example data flow for preparing data for storing to a storage device, according to some embodiments.

FIG. 2 illustrates an example data flow 200 for preparing the data for storing to a storage device, according to some embodiments. As shown in FIG. 2, a data payload 202, which includes data 202a, an LA 202b, and metadata 202c, is received for storing in the memory 102 of a storage device. As discussed with reference to FIG. 1, the CRC encoder 104 can be used to calculate a CRC value 204 over the data payload 202. The ECC encoder 106 can be used to perform an error correction encoding over the data payload 202 and the CRC value 204 to generate an ECC value 206. In some implementations, the ECC can be a low-density parity-check (LDPC) code. The LDPC code can use up to M number of parity bits, wherein M is pre-determined based on the implementation. The scrambler 108 can be used to scramble the data payload 202, the CRC value 204, and the ECC value 206 to generate scrambled data 208 using the pseudo-random seed generated by the seed generator 110. The scrambled data 208 can be stored in the memory 102 as a storage data unit at the PA associated with the LA 202b.

In some cases, the storage data unit stored in the memory 102 may get corrupted, or the stored data retrieved from the memory 102 may not be the same as the storage data unit originally stored in the memory 102. The errors can be caused by data corruption (e.g., result of memory wear, read disturb, program disturb, retention error, etc.) or address corruption. Some of the errors can be corrected and the original data can be recovered. However, in some cases, uncorrectable errors can occur that cannot be corrected easily. It is desirable to identify the type of error (e.g., the failure mechanism) that has occurred, so that any appropriate mitigation action can be employed.

The plurality of error types may include a type of error that can occur due to L2P (logical to physical address) corruption in the translation between the LA and the PA. The L2P corruption may cause a read command to read the stored data from the memory 102 using a wrong PA. For example, the L2P corruption may occur due to a bug in the firmware code, or a corruption in the address translation table comprising the translations between the LAs and the PAs, which can provide a wrong PA for a given LA. A mis-correction event in the DRAM storing the address translation table (e.g., a 3-bit error is mis-corrected into a 4-bit error) can also provide a wrong PA for a given LA.

The plurality of error types may also include a type of error that can occur due to a PA corruption in the memory 102. For example, the memory 102 may internally corrupt the PA used for reading the stored data, and fetch the data from a wrong PA. A media defect can also cause corruption in the stored data. Both the PA corruption and media defect may have similar failure characteristics.

The plurality of error types may also include a type of error that indicates a reliability issue. In some examples, the reliability failure can occur when the failed bit count (FBC) of the memory 102 is higher than the ECC correction capability. As an example, in some cases, the FBC can be higher than normal but not as high as a media defect, e.g., the raw bit error rate (RBER) is higher than the ECC correction capability but less than 2.5%.

In some instances, when a read command is issued to read the stored data in the memory 102 using the LA 202b, the stored data retrieved from the memory 102 may include an error. Referring back to FIG. 1, the retrieved data can be de-scrambled by a de-scrambler 112 using a pseudo-random seed to generate a de-scrambled data unit. The pseudo-random seed can be generated by a seed generator 114 using the PA associated with the LA 202b. The seed generator 114 can be similar to or is the same seed generator as seed generator 110. In some implementations, the seed generator 114 and the seed generator 110 can be the same entity. An initial checksum generator 116 can be used to compute an initial checksum (ICS) over the de-scrambled data unit.

An ECC decoder 118 can be used to perform error correction decoding on the de-scrambled data unit to generate a decoded data payload comprising decoded data, a decoded LA, and decoded metadata. In some implementations, the error correction decoding is a LDPC decoding process, and ECC decoder 118 may include multiple decoders that employ different decoding algorithms (e.g., bit-flipping, min-sum, etc.). A decoder status from the ECC decoder 118 may include a "pass" status indicating that the ECC decoding was successful, or a "fail" status indicating that the ECC decoding was not successful. An LA checker 120 can be used to compare the given LA with the decoded LA to provide an LA match status indicating a "match" when the decoded LA is the same as the given LA, and a "mismatch" when the decoded LA is not the same as the given LA. A failure analyzer 122 can be used to perform UECC failure analysis to determine the type of error that has occurred based on a combination of the ICS, the decoder status, and the LA match status. An example data flow for retrieving the data from the memory 102 is described with reference to FIG. 3.

Figure 3:
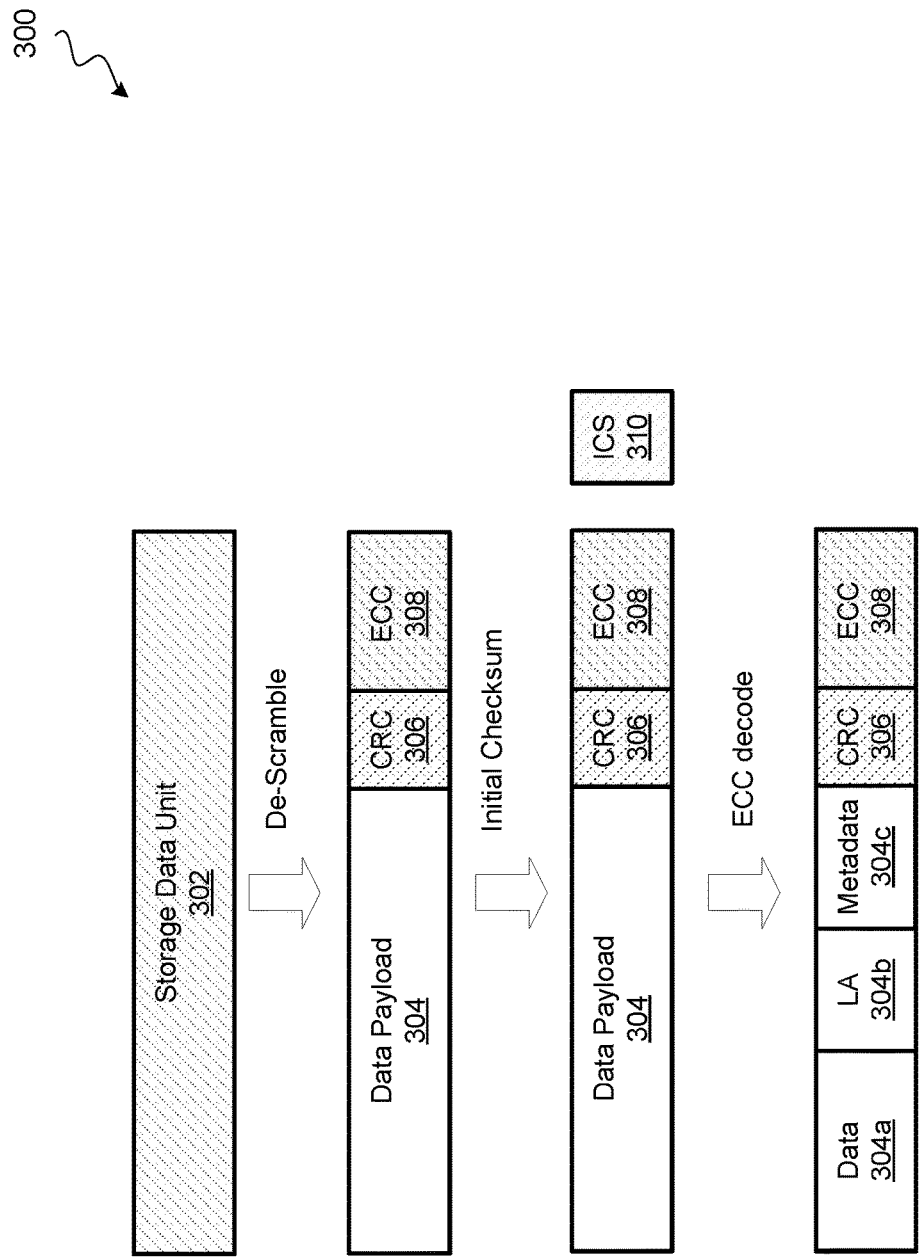
FIG. 3 illustrates an example data flow for retrieving data from a storage device, according to some embodiments.

FIG. 3 illustrates an example data flow 300 for retrieving the data from a storage device, according to some embodiments. A storage data unit 302 can be retrieved from the memory 102 using a given LA. For example, the host application may issue a read command to read the data stored in the memory 102 using a given LA. The de-scrambler 112 can de-scramble the storage data unit 302 to generate a de-scrambled data unit using a pseudo-random seed generated by the seed generator 114. The de-scrambled data unit may comprise a data payload 304, a CRC value 306, and an ECC value 308. The initial checksum generator 116 may compute an ICS 310 over the de-scrambled data unit. If any error is present, the ECC decoder 118 may perform the error correction decoding on the de-scrambled data unit to generate the decoded data payload 304 comprising decoded data 304a, a decoded LA 304b, and decoded metadata 304c. The error correction decoding also attempts to correct any error occurring in the CRC value 306 and the ECC value 308.

The failure analyzer 122 can be used to determine which type of error has occurred from a plurality of error types based on the ICS 310, the decoder status, and the LA match status. For example, the failure analyzer 122 may determine the type of error based on one or more of whether the ICS 310 exceeds a parity threshold (PT), the decoder status is pass or fail, and the decoded LA 304b matches the LA 202b. The PT may be determined based on a maximum number of parity bits used for the LDPC code. This is further described with reference to FIG. 4.

FIG. 4 illustrates an example table 400 for UECC failure analysis logic 402 that can be used to determine a type of error from a plurality of error types, according to some embodiments. The UECC failure analysis logic 402 can be implemented by the failure analyzer 122 in hardware, software, or a combination thereof.

As shown in the table 400, an error type 404 may include a plurality of error types, e.g., L2P corruption 404a, memory PA corruption or media defect 404b, and reliability issue 404c. An error event may occur with the ICS 310 being greater than the PT, and a "fail" decoder status indicating that the decoder was not able to recovery the data. The PT may be based on the number of parity bits used by the ECC encoder 106. As an example, the PT can be 40% of the number of parity bits used for the LDPC encoding. The failure analyzer 122 may determine based on this error event that the failure mechanism is beyond the reliability issue 404c, and that the type of uncorrectable error that has occurred is instead due to memory PA corruption or media defect 404b, and possibly the L2P corruption 404a. In such scenarios, the storage device may alert the host of a potential memory failure.

A different error event may occur with the ICS 310 being less than the PT, and a "pass" decoder status. If the LA status indicates a "mismatch," the failure analyzer 122 may determine based on this error event that the type of error that has occurred is due to L2P corruption 404a. In this case, the failure analyzer 122 may rule out the memory PA corruption or media defect 404b, or the reliability failure 404c. Because the ECC decoder is able to recover the data payload but the decoded LA mismatches the LA that was used to read the data, failure analyzer 122 can determine that the error is caused by L2P corruption 404a. In such scenarios, to mitigate against the L2P corruption, the storage device may, for example, move the address translation table to another location in the random-access memory.

When the ICS 310 is less than the PT, the decoder status is "pass," and the LA status indicates a "match," the error event is not a UECC event. The ECC decoder is able to correctly recover the data with a matching logical address. Hence, the error is not due to L2P corruption or physical address corruption. The error is also not considered to be a reliability issue or a media defect because the error is correctable.

The failure analyzer 122 may detect another failure event when the ICS 310 is less than the PT, and the decoder status is "fail." The failure analyzer 122 may determine based on this failure event that the memory is exhibiting a reliability issue 404c as the type of uncorrectable error, and possibly the L2P corruption 404a. In this case, the failure analyzer 122 may rule out the memory PA corruption or media defect 404b. The block associated with the LA can be marked as a bad block to prevent new data from using this block.

Figure 5:
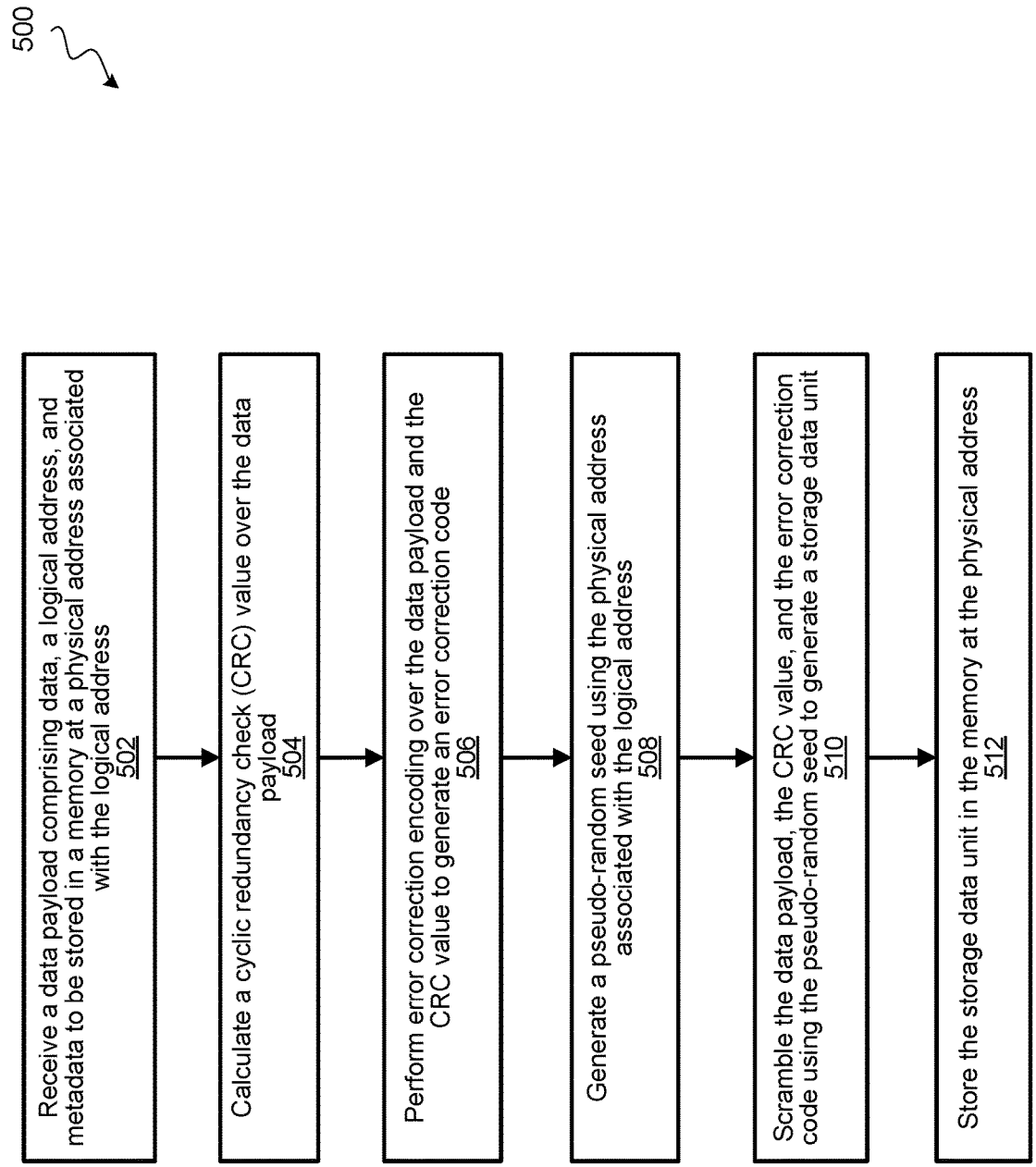
FIG. 5 illustrates a flow diagram of an example of a process for storing data to a storage device, according to some embodiments.

FIG. 5 illustrates a flow diagram of an example of a process 500 for storing data to a storage device, according to some embodiments. Process 500 can be performed, for example, by a memory controller of a memory of the storage device. In some implementations, process 500 can be implemented using circuitry in the memory controller, software code (e.g., firmware, error handling code, etc.) executed by a processor of the memory controller, or a combination of both.

Process 500 may begin at block 502 by receiving a data payload comprising data, a logical address, and metadata to be stored in a memory at a physical address associated with the logical address. For example, the data payload can be the data payload 202 comprising the data 202a, the LA 202b, and the metadata 202c, which is received to be stored in the memory 102 at the PA associated with the LA 202b. At block 504, a cyclic redundancy check (CRC) value is computed over the data payload. The CRC encoder 104 can calculate the CRC value 204 over the data payload 202. At block 506, an error correction encoding is performed over the data payload and the CRC value to generate an error correction code. The ECC encoder 106 can perform the error correction encoding over the data payload 202 and the CRC value 204 to generate the ECC value 206. The error correction encoding can be, for example, an LDPC encoding process.

At block 508, a pseudo-random seed is generated using the physical address associated with the logical address. A pseudo-random seed is generated by the seed generator 110 using the PA associated with the LA 202b. At block 510, the data payload, the CRC value, and the error correction code are scrambled using the pseudo-random seed to generate a storage data unit. The data payload 202, the CRC value 204, and the ECC value 206 can be scrambled by the scrambler 108 using the pseudo-random seed to generate the storage data unit. At block 512, the storage data unit is stored in the memory at the physical address. For example, the storage data unit is written to the memory 102, which can be a non-volatile memory, such as a flash memory of the storage device.

Figure 6:
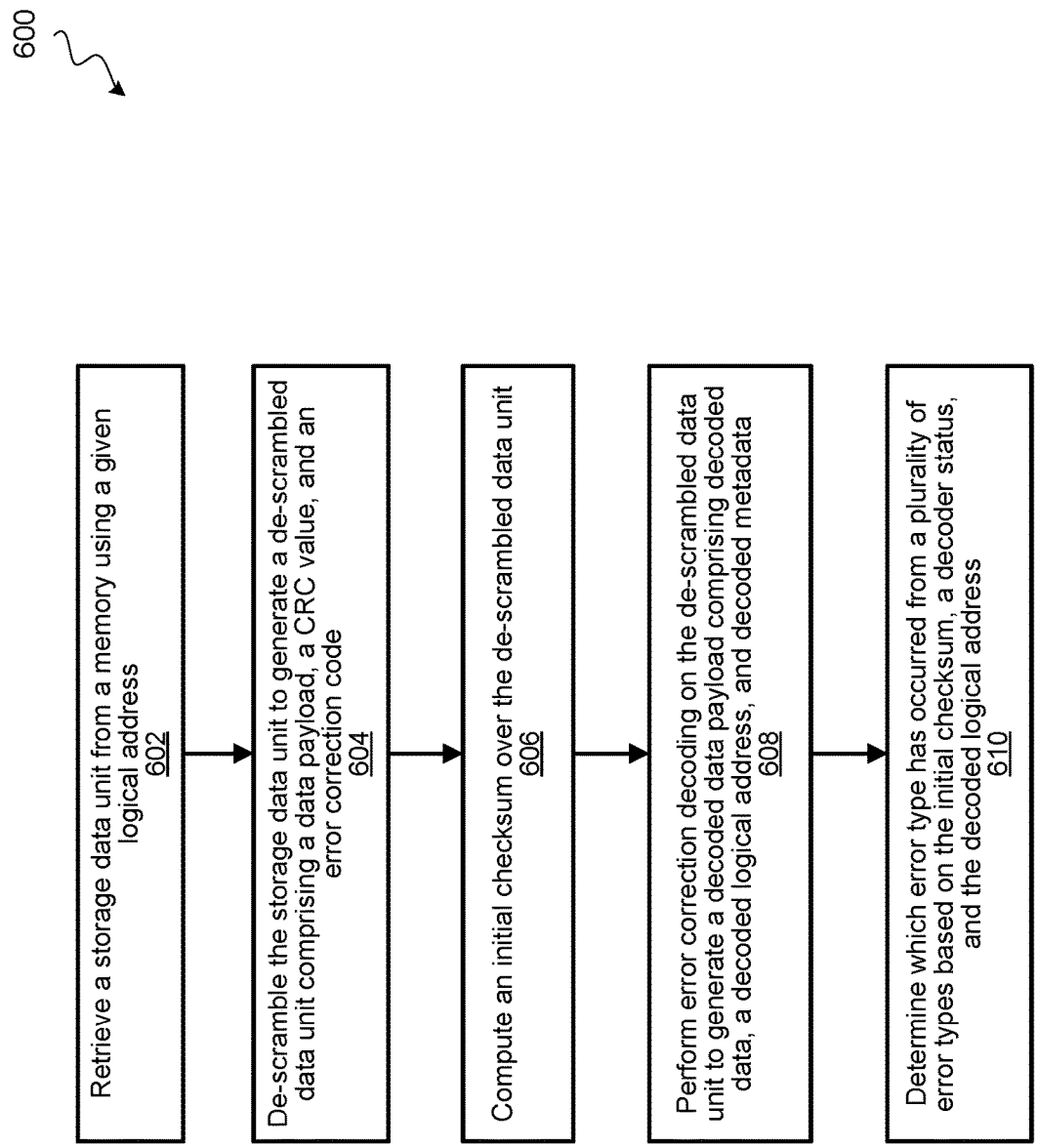
FIG. 6 illustrates a flow diagram of an example of a process for retrieving data from a storage device, according to some embodiments.

FIG. 6 illustrates a flow diagram of an example of a process 600 for retrieving data from a storage device, according to some embodiments. Process 600 can be performed, for example, by a memory controller of a memory of the storage device. In some implementations, process 600 can be implemented using circuitry in the memory controller, software code (e.g., firmware, error handling code, etc.) executed by a processor of the memory controller, or a combination of both.

Process 600 may begin at block 602 by retrieving a storage data unit from a memory using a given logical address. For example, the storage data unit can be retrieved in response to a host device requesting the data from the memory 102. The storage data unit can be the storage data unit 302. At block 604, the storage data unit is de-scrambled to generate a de-scrambled data unit. The storage data unit 302 can be de-scrambled by the de-scrambler 112 using a pseudo-random seed generated by the seed generator 114 based on the PA. The de-scrambled data unit may comprise the data payload 304, the CRC value 306, and the ECC value 308. At block 606, an initial checksum over the de-scrambled data unit is calculated. The initial checksum generator 116 may generate the ICS 310 over the data payload 304, the CRC value 306, and the ECC value 308.

At block 608, if the initial checksum indicates there is an error in the data read from memory 102, error correction decoding is performed on the de-scrambled data unit to generate a decoded data payload comprising decoded data, a decoded logical address, and decoded metadata. The ECC decoder 118 may perform the error correction decoding on the de-scrambled data unit to generate the data payload 304 comprising the decoded data 304a, the decoded LA 304b, and the decoded metadata 304c. The ECC decoder 118 may also attempt to correct any error occurring in the CRC value 306 and the ECC value 308. The error correction decoding can be, for example, an LDPC decoding process such as bit-flipping, min-sum, etc.

At block 610, a type of error that has occurred can be determined from a plurality of error types based on the initial checksum, a decoder status, and the decoded logical address. The failure analyzer 122 may determine the type of error based on the decoder status, the ICS 310, and the LA match status. The LA match status indicates a "match" when the decoded LA 304b is the same as the LA 202b, and a "mismatch" when the decoded LA 304b is not the same as the LA 202b. As described with reference to the table 400, the type of error 404 (e.g., failure mechanism) can be one or more of the L2P corruption 404a, the memory PA corruption or media defect 404b, or the reliability failure 404c.

As described with reference to FIGS. 1-6, the techniques described herein can be used to detect and differentiate between different types of UECC failure events, which can help determine the mitigation action for the uncorrectable errors in the storage device. The failure analysis to determine the type of error that has occurred can be performed offline, and does not impact the performance of the storage device.

Figure 7:
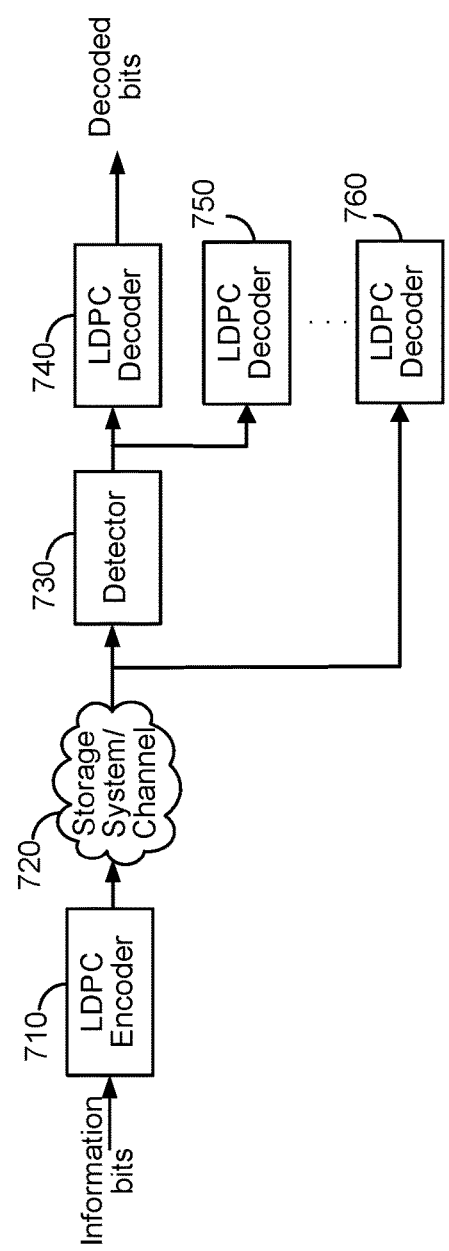
FIG. 7 illustrates an example high level block diagram of an error correction system, according to some embodiments.

FIG. 7 illustrates an example high level block diagram of an error correction system 700, in accordance with certain embodiments. The UECC failure analysis techniques described above can be implemented using the error correction system 700 to differentiate between different types of uncorrectable errors that have occurred in the stored data. In the example, low-density parity-check (LDPC) codes are described in connection with data storage. However, the embodiments of the present disclosure are not limited as such. Instead, the embodiments similarly apply to other usages of LDPC codes including, for example, data transmission. Further, the embodiments of the present disclosure can similarly apply to other error correction codes.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to a number of non-zero values in a specific row of the parity-check matrix H. In general, if column weights of all the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

LDPC codes are also classified according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 710 receives information bits that include data which is to be stored in a storage system 720. LDPC encoded data is outputted by the LDPC encoder 710 and is written to the storage system 720. In various embodiments, the storage system 720 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 730 receives data from the storage system 720. The received data may include some noise or errors. The detector 730 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how certain the detector is in that decision (e.g., a large magnitude indicates a high reliability or certainty).

The decision and/or reliability information is passed to an LDPC decoder 740 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 740 are passed to the appropriate entity (e.g., the user or application which requested it). With proper encoding and decoding, the information bits match the decoded bits.

Although the output of the detector 730 may be beneficial for some LDPC decoders, not all error correction systems are configured with a detector. Further, the processing performed by detector 730 may be computation intensive, especially in regard to computing reliability information, which could significantly offset the advantages of using faster decoders such as BF decoders. Accordingly, in some implementations, LLR or other reliability information provided by a detector such as the detector 730 is not used as input to a BF decoder. Instead, the BF decoder may be configured to determine reliability for itself, e.g., through identifying unreliable check nodes using the techniques described below. However, the output of detector 730 may still be used for generating input to other decoders in the error correction system. The error correction system 800 may include multiple ECC or LDPC decoders that form a decoder hierarchy in which decoding is first attempted using a faster and/or less complex decoder (e.g., a BF decoder) before resorting to a slower and/or more complex decoder (e.g., an MS decoder). Accordingly, the error correction system 700 may include one or more additional LDPC decoders (e.g., an LDPC decoder 750 and an LDPC decoder 760), where at least some of the additional LDPC decoders do not receive output of the detector 730 (e.g., the LDPC decoder 760, as shown in FIG. 7). Further, in the case of a BF decoder implemented in accordance with one or more embodiments described herein, such a BF decoder may optionally be configured to use decision information from a detector such as the detector 730.

In various embodiments, an error correction system such as the system 700 in FIG. 7 may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable nodes (VNs, also referred to as bit nodes) correspond to elements of the codeword and the other set of nodes, e.g., check nodes (CNs), correspond to the set of parity-check constraints satisfied by the codeword. Typically, the edge connections are chosen at random. The error correction capability of an LDPC code is improved if cycles of short length are avoided in the graph. In an (r,c) regular code, each of the n variable nodes (e.g., V0, V1, V2 . . . Vn−1) has connections to r check nodes, and each of the m check nodes (e.g., C0, C1, C2 . . . Cm−1) has connections to c variable nodes. Each check node represents a separate parity-check equation. Thus, r corresponds to the number of parity-check equations involving each code bit and also the degree of each variable node. Similarly, c corresponds to the number of code bits involved in each parity-check equation and also the degree of each check node. The number of variable nodes (n) corresponds to the total number of bits (data and parity) in the code (the codeword length).

In an irregular LDPC code, the check node degree is not uniform. Similarly, the variable node degree is not uniform. In QC-LDPC codes, the parity-check matrix H can be structured into blocks of p×p matrices such that a bit in a block participates in only one parity-check equation in the block, and each parity-check equation in the block involves only one bit from the block. In QC-LDPC codes, a cyclic shift of a codeword by p results in another codeword. Here p is the size of a square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 8A, 8B:
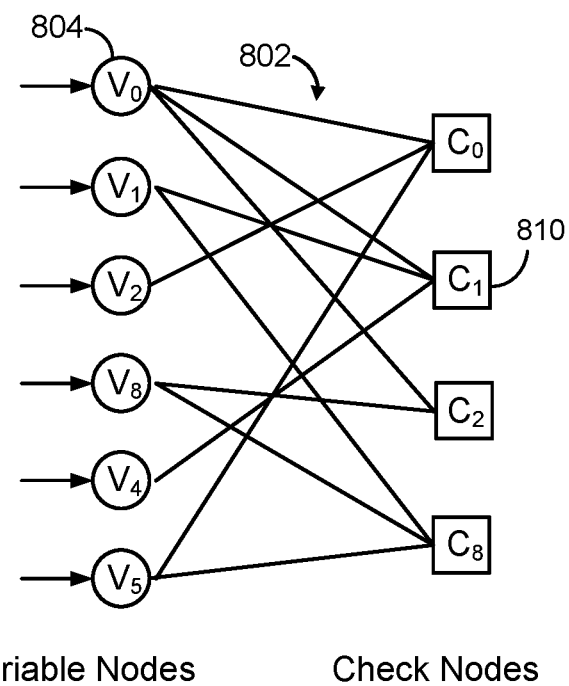
FIG. 8A illustrates an example parity-check matrix, according to some embodiments.
FIG. 8B illustrates an example bipartite graph, according to some embodiments.

FIG. 8A illustrates an example parity-check matrix H 800 and FIG. 8B illustrates an example bipartite graph corresponding to the parity-check matrix 800, in accordance with certain embodiments of the present disclosure. In this example, the parity-check matrix 800 has six column vectors and four row vectors. In practice, parity-check matrices tend to be much larger. Network 802 forms a bipartite graph representing the parity-check matrix 800. Various type of bipartite graphs are possible, including, for example, a Tanner graph.

Generally, the variable nodes in the network 802 correspond to the column vectors in the parity-check matrix 800. The check nodes in the network 802 correspond to the row vectors of the parity-check matrix 800. The interconnections between the nodes are determined by the values of the parity-check matrix 800. Specifically, a "1" indicates that the CN and VN at the corresponding row and column position have a connection. A "0" indicates there is no connection. For example, the "1" in the leftmost column vector and the second row vector from the top in the parity-check matrix 800 corresponds to the connection between a VN 804 and a CN 810 in FIG. 8B. Collectively, the check nodes represent a syndrome computed through applying the parity-check equations represented by the parity-check matrix 800 to the received codeword. A syndrome weight (also known as a checksum) can be computed by summing together the bit-values of all the check nodes.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 8B. The connections between variable nodes and check nodes are described by and correspond to the values of the parity-check matrix 800, as shown in FIG. 8A. The content of a message passed from a variable node to a check node or vice versa depends on the message passing algorithm used.

A hard decision message passing algorithm may be performed in some instances. In a first step, each of the variable nodes sends a message to one or more check nodes that are connected to it. In this case, the message is a value that each of the variable nodes believes to be its correct value. The values of the variable nodes may be initialized according to the received codeword.

In the second step, each of the check nodes calculates a response to send to the variable nodes that are connected to it using the information that it previously received from the variable nodes. This step can be referred to as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, meaning the value of each check node is zero, then the resulting checksum is also zero, so the decoding algorithm declares that a correct codeword is found and decoding terminates. If a correct codeword is not found (e.g., the value of any check node is one), the iterations continue with another update from the variable nodes using the messages that they received from the check nodes to decide if the bit at their position should be a zero or a one, e.g., using a majority voting rule in which the value of a variable node is set to the value of a majority of the check nodes connected to the variable node. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes can also include reliability information for each bit.

Figure 9:
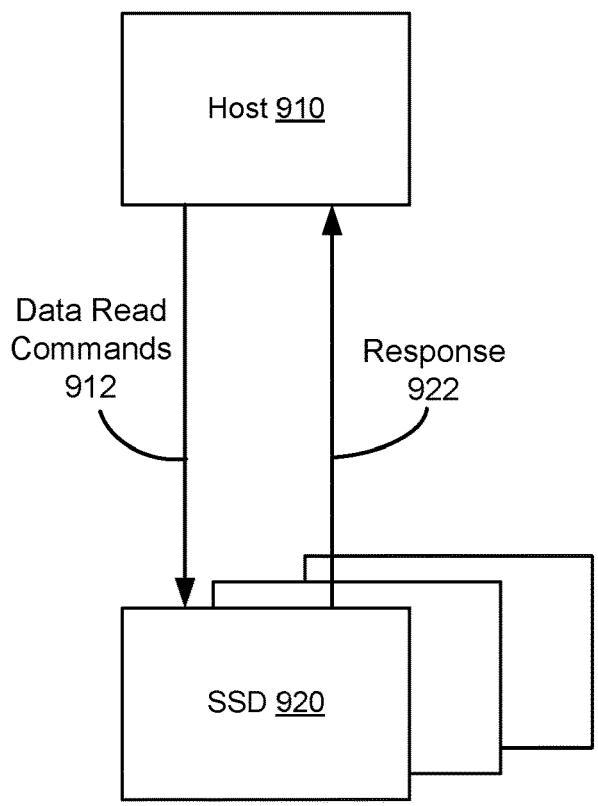
FIG. 9 illustrates a simplified block diagram of a computing system, according to some embodiments.

FIG. 9 illustrates an example architecture of a computing system 900, in accordance with certain embodiments of the present disclosure. In an example, the computer system 900 includes a host 910 and one or more solid state drives (SSDs) 920. The host 910 stores data on behalf of clients, e.g., the SSDs 920. The data is stored in an SSD as codewords for ECC protection. For instance, the SSD can include an error correction system comprising one or more ECC encoders (e.g., the LDPC encoder 710 of FIG. 7).

The host 910 can receive a request from a client for the client's data stored in the SSDs 920. In response, the host sends data read commands 912 to the SSDs 920 as applicable. Each of the SSDs 920 processes the received data read command and sends a response 922 to the host 910 upon completion of the processing. The response 922 can include the read data and/or a decoding failure. In an example, each of the SSDs includes at least one ECC decoder (e.g., one or more of the LDPC decoders in FIG. 7). Further, at least one of the SSDs 920 may include a BF decoder. In particular, some or all of the SSDs 920 may include a BF decoder that takes into account information about unreliable check nodes when deciding whether to flip the bit-value of a variable node, where the information about unreliable check nodes is determined through building a set of unreliable check nodes using the techniques described below.

Processing the data read command and sending the response 922 includes decoding by the ECC decoder(s) the codewords stored in the SSD to output the read data and/or the decoding failure. Some of the codewords may be decoded by a BF decoder, or some other decoding technique applied to circulant submatrices.

In an example where an SSD 920 includes a BF decoder and one or more additional ECC decoders, the SSD may be configured to attempt an initial decoding of its stored codewords using the BF decoder. The one or more additional ECC decoders can remain inactive while the BF decoder is decoding. If the decoding by the BF decoder is unsuccessful, the SSD may select one of the additional ECC decoders (e.g., based on a hierarchical order) for performing decoding. Thus, the one or more additional ECC decoders may act as backup decoders in the event that the BF decoder cannot fully decode a codeword. A backup decoder need not process all the codewords input to the BF decoder. Instead, in some examples, the input to a backup decoder is a subset of the input to a previously selected decoder, where the subset corresponds to codewords that the previously selected decoder failed to fully decode. Further, some of the additional ECC decoders may be operated in parallel with the BF decoder to perform parallel processing of codewords. For example, as discussed below in connection with FIG. 10, an incoming set of codewords can be distributed across a BF decoder and an MS decoder so that each decoder processes a distinct subset of codewords.

Generally, an SSD can be a storage device that stores data persistently or caches data temporarily in nonvolatile semiconductor memory and is intended for use in storage systems, servers (e.g., within datacenters), and direct-attached storage (DAS) devices. A growing number of applications need high data throughput and low transaction latency, and SSDs are used as a viable storage solution to increase performance, efficiency, and reliability. SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers).

Figure 10:
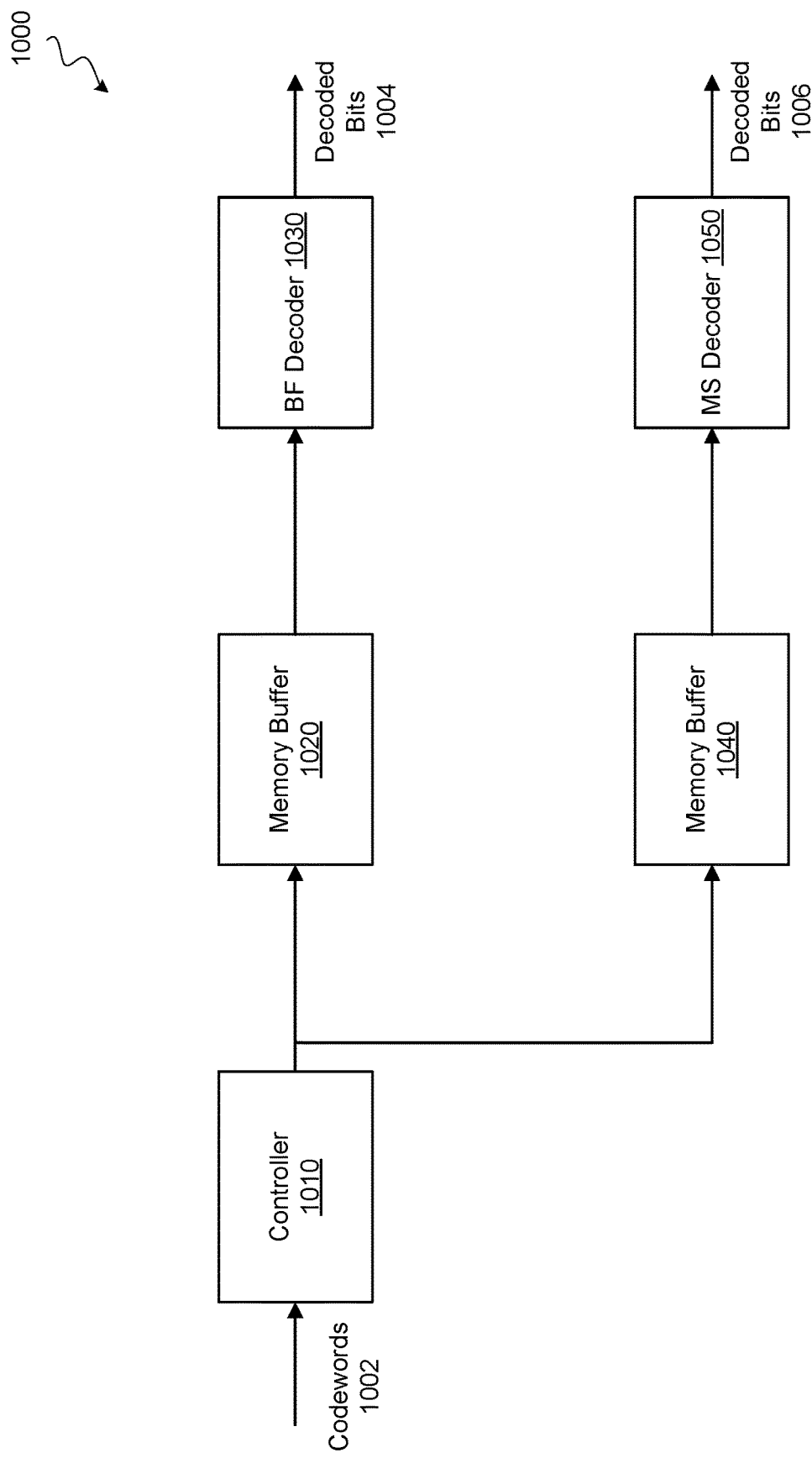
FIG. 10 illustrates an example error correction system that includes multiple decoders, according to some embodiments.

FIG. 10 illustrates an example error correction system 1000 that includes multiple ECC decoders, in accordance with certain embodiments of the present disclosure. The error correction system 1000 can be included in a memory device, such as an SSD 920 of FIG. 9. In turn, the error correction system 1000 includes a controller 1010, a memory buffer 1020 corresponding to a BF decoder 1030, and a memory buffer 1040 corresponding to a min-sum (MS) decoder 1050. The controller 1010 can determine which of the two decoders 1030 and 1050 are to be used to decode different codewords 1002 based on an estimate of the number of raw bit-errors for each of the codewords. The bit-errors can be due to noise and, accordingly, the codewords 1002 can include noisy codewords. The BF decoder 1030 outputs decoded bits 1004 corresponding to one or more of the codewords 1002, where the decoded bits 1004 remove some or all of the noise (e.g., correct the error bits). Similarly, the MS decoder 1050 outputs decoded bits 1006 corresponding to remaining one or more of the codewords 1002, where the decoded bits 1006 remove some or all of the noise (e.g., correct the error bits).

If the controller 1010 determines that a codeword has a severe bit error rate, a decoding failure is likely with the two decoders 1030 and 1050. In such instances, and assuming that the only decoders in the error correction system 1000 are the decoders 1030 and 1050, the controller 1010 may skip decoding altogether to, instead, output an error message. Otherwise, the codeword can be dispatched to the BF decoder 1030 when the controller 1010 determines that the bit-error rate falls within the error correction capability of the BF decoder 1030. Alternatively, the codeword can be dispatched to the MS decoder 1050 when the controller 1010 determines that the bit-error rate is outside the error correction capability of the BF decoder 1030 but within the error correction capability of the MS decoder 1050. Dispatching the codeword includes storing the codeword into one of the memory buffers 1020 or 1040 depending on the controller's 1010 determination. The memory buffers 1020 and 1040 are used because, in certain situations, the decoding latency is slower than the data read rate of a host reading the codewords 1002.

Accordingly, over time, the codewords 1002 are stored in different input queues for the BF decoder 1030 and the MS decoder 1050. For typical SSD usage, it is expected that most traffic would go to the BF decoder 1030. Hence, it is important that the BF decoder's performance is improved. Although FIG. 10 illustrates only one low latency and high throughput decoder (BF decoder 1030) and one high error correction capability decoder (MS decoder 1050), a different number of decoders can be used. For instance, a second BF decoder can be also used and can have the same or a different configuration than the BF decoder 1030.

Figure 11:
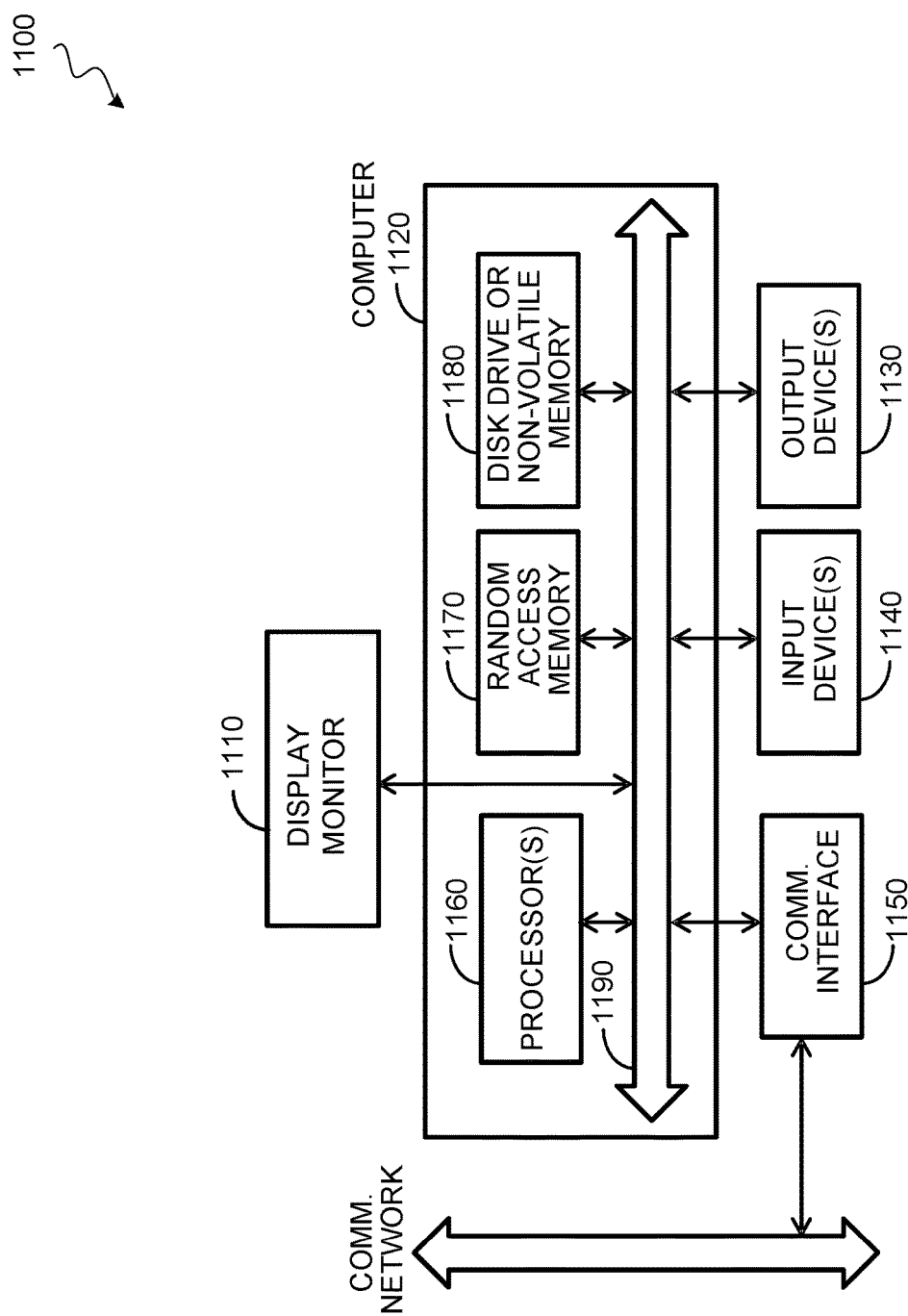
FIG. 11 illustrates a block diagram of a computer system, according to some embodiments.

FIG. 11 illustrates a computer system 1100 usable for implementing one or more embodiments of the present disclosure. FIG. 11 is merely an example and does not limit the scope of the disclosure as recited in the claims. As shown in FIG. 11, the computer system 1100 may include a display monitor 1110, a computer 1120, user output devices 1130, user input devices 1140, a communications interface 1150, and/or other computer hardware or accessories. The computer system 1100 or select components of the computer system 1100 can be used to implement the error correction system 700 of FIG. 7 and/or the error correction system 900 of FIG. 9.

As shown in FIG. 11, the computer 1120 may include one or more processors 1160 that communicate with a number of peripheral devices via a bus subsystem 1190. These peripheral devices may include the user output devices 1130, the user input devices 1140, the communications interface 1150, and a storage subsystem, such as a random-access memory (RAM) 1170 and a disk drive or non-volatile memory 1180.

The user input devices 1140 include all possible types of devices and mechanisms for inputting information to the computer 1120. These may include a keyboard, a keypad, a touch screen incorporated into the display, audio input devices such as voice recognition systems, microphones, and other types of input devices. In various embodiments, the user input devices 1140 are typically embodied as a computer mouse, a trackball, a track pad, a joystick, a wireless remote, a drawing tablet, a voice command system, an eye tracking system, and the like. The user input devices 1140 typically allow a user to select objects, icons, text and the like that appear on the monitor 1110 via a command such as a click of a button or the like.

The user output devices 1130 include all possible types of devices and mechanisms for outputting information from the computer 1120. These may include a display (e.g., the monitor 910), non-visual displays such as audio output devices, etc.

The communications interface 1150 provides an interface to other communication networks and devices. The communications interface 1150 may serve as an interface for receiving data from and transmitting data to other systems. Embodiments of the communications interface 1150 typically include an Ethernet card, a modem (telephone, satellite, cable, ISDN), (asynchronous) digital subscriber line (DSL) unit, FireWire interface, USB interface, and the like. For example, the communications interface 1150 may be coupled to a computer network, to a FireWire bus, or the like. In other embodiments, the communications interfaces 1150 may be physically integrated on the motherboard of the computer 1120, and may be a software program, such as soft DSL, or the like.

In various embodiments, the computer system 1100 may also include software that enables communications over a network such as the HTTP, TCP/IP, RTP/RTSP protocols, and the like. In alternative embodiments of the present disclosure, other communications software and transfer protocols may also be used, for example IPX, UDP or the like.

The RAM 1170 and the disk drive 1180 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 1170 and the disk drive 1180 may be configured to store the basic programming and data constructs that provide the functionality of the present disclosure.

Software code modules and instructions that provide the functionality of the present disclosure may be stored in the RAM 1170 and the disk drive 1180. These software modules may be executed by the processor(s) 1160. The RAM 1170 and the disk drive 1180 may also provide a repository for storing data used in accordance with the present disclosure.

The RAM 1170 and the disk drive 1180 may include a number of memories including a main random-access memory (RAM) for storage of instructions and data during program execution and a read-only memory (ROM) in which fixed non-transitory instructions are stored. The RAM 1170 and the disk drive 1080 may include a file storage subsystem providing persistent (non-volatile) storage for program and data files. The RAM 1170 and the disk drive 1180 may also include removable storage systems, such as removable flash memory.

The bus subsystem 1190 provides a mechanism for letting the various components and subsystems of the computer 1120 communicate with each other as intended. Although the bus subsystem 1190 is shown schematically as a single bus, alternative embodiments of the bus subsystem may utilize multiple busses.

It will be readily apparent to one of ordinary skill in the art that many other hardware and software configurations are suitable for use with the present disclosure. For example, the computer 1120 may be a desktop, portable, rack-mounted, or tablet configuration. Additionally, the computer 1120 may be a series of networked computers. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, and magnetic and optical storage devices, such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that the disclosure's usefulness is not limited thereto and that the embodiments of the present disclosure can be beneficially implemented in any number of environments for any number of purposes.

What is claimed is:

1. A method comprising:
   receiving a data payload comprising data, a logical address, and metadata to be stored in a memory at a physical address associated with the logical address;
   calculating a cyclic redundancy check (CRC) value over the data payload;
   performing error correction encoding over the data payload and the CRC value to generate an error correction code;
   generating a pseudo-random seed using the physical address associated with the logical address;
   scrambling the data payload, the CRC value, and the error correction code using the pseudo-random seed to generate a storage data unit; and
   storing the storage data unit in the memory at the physical address.

2. The method of claim 1, further comprising:
   reading stored data from the memory using the logical address;
   de-scrambling the stored data to obtain a de-scrambled data unit based on the physical address associated with the logical address;
   computing an initial checksum over the de-scrambled data unit;
   performing error correction decoding over the de-scrambled data unit to obtain a decoded logical address; and
   determining which error type has occurred from a plurality of error types based on the initial checksum, a decoder status, and the decoded logical address.

3. The method of claim 2, wherein determining which error type has occurred includes performing one or more of:
   determining whether the initial checksum exceeds a parity threshold;
   determining whether the decoder status is pass or fail; or
   determining whether the decoded logical address matches the logical address.

4. The method of claim 2, wherein the plurality of error types includes a first error type for address translation corruption, a second error type for physical address corruption or memory defect, and a third error type for reliability failure.

5. A method comprising:
   retrieving a storage data unit from a memory using a given logical address;
   de-scrambling the storage data unit to generate a de-scrambled data unit, the de-scrambled data unit comprising a data payload, a cyclic redundancy check (CRC) value, and an error correction code;
   computing an initial checksum over the de-scrambled data unit;
   performing error correction decoding on the de-scrambled data unit to generate a decoded data payload comprising decoded data, a decoded logical address, and decoded metadata; and
   determining which error type has occurred from a plurality of error types based on the initial checksum, a decoder status, and the decoded logical address.

6. The method of claim 5, wherein the de-scrambling is performed using a pseudo-random seed generated from a physical address associated with the given logical address.

7. The method of claim 5, wherein the plurality of error types includes an error type for address translation corruption.

8. The method of claim 7, wherein the address translation corruption is determined to have occurred when the initial checksum is less than a parity threshold, the decoder status indicates that the error correction decoding is successful, and the given logical address does not match the decoded logical address.

9. The method of claim 5, wherein the plurality of error types includes an error type for physical address corruption or memory defect.

10. The method of claim 9, wherein the physical address corruption or the memory defect is determined to have occurred when the decoder status indicates that the error correction decoding has failed, and the initial checksum is greater than a parity threshold.

11. The method of claim 5, wherein the plurality of error types includes an error type for reliability failure.

12. The method of claim 11, wherein the reliability failure is determined to have occurred when the decoder status indicates that the error correction decoding has failed, and the initial checksum is less than a parity threshold.

13. The method of claim 5, wherein the error correction decoding is performed using a low-density parity-check (LDPC) code.

14. A storage device comprising:
a memory; and
a controller operable to:
retrieve a storage data unit from the memory using a given logical address;
de-scramble the storage data unit to generate a de-scrambled data unit, the de-scrambled data unit comprising a data payload, a cyclic redundancy check (CRC) value, and an error correction code;
compute an initial checksum over the de-scrambled data unit;
perform error correction decoding on the de-scrambled data unit to generate a decoded data payload comprising decoded data, a decoded logical address, and decoded metadata; and
determine which error type has occurred from a plurality of error types based on the initial checksum, a decoder status, and the decoded logical address.

15. The storage device of claim 14, wherein the controller is further operable to:
generate a pseudo-random seed from a physical address associated with the given logical address to descramble the storage data unit.

16. The storage device of claim 14, wherein the plurality of error types includes a first error type for address translation corruption, a second error type for physical address corruption or memory defect, and a third error type for reliability failure.

17. The storage device of claim 16, wherein the first error type is determined to have occurred when the initial checksum is less than a parity threshold, the decoder status indicates that the error correction decoding is successful, and the given logical address does not match the decoded logical address.

18. The storage device of claim 16, wherein the second error type is determined to have occurred when the decoder status indicates that the error correction decoding has failed, and the initial checksum is greater than a parity threshold.

19. The storage device of claim 16, wherein the third error type is determined to have occurred when the decoder status indicates that the error correction decoding has failed, and the initial checksum is less than a parity threshold.

20. The storage device of claim 14, wherein the error correction code is a low-density parity-check (LDPC) code, and wherein a parity threshold used for determining which error type is based on a maximum number of parity bits used for the LDPC code.

* * * * *